US009685252B2

(12) United States Patent
Wang et al.

(10) Patent No.: US 9,685,252 B2
(45) Date of Patent: Jun. 20, 2017

(54) ALUMINUM ELECTRODE, METHOD OF FORMING AN ALUMINUM ELECTRODE AND ELECTRONIC DEVICE THEREWITH

(71) Applicant: BOE TECHNOLOGY GROUP CO., LTD., Beijing (CN)

(72) Inventors: Can Wang, Beijing (CN); Fang Liu, Beijing (CN); Yingwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/527,518

(22) Filed: Oct. 29, 2014

(65) Prior Publication Data

US 2016/0035452 A1 Feb. 4, 2016

(30) Foreign Application Priority Data

Jul. 31, 2014 (CN) .......................... 2014 1 0372811

(51) Int. Cl.
*H01L 23/48* (2006.01)
*H01B 1/02* (2006.01)
(Continued)

(52) U.S. Cl.
CPC .......... *H01B 1/023* (2013.01); *B32B 15/017* (2013.01); *C23C 14/16* (2013.01); *C23C 14/18* (2013.01)

(58) Field of Classification Search
CPC ......... H01L 29/01078; H01L 29/01079; H01L 29/01013; H01L 29/14; C23C 14/16; C23C 14/18; H01B 1/023; B32B 15/017
(Continued)

(56) References Cited

U.S. PATENT DOCUMENTS

| 2008/0099853 A1 | 5/2008 | Yang et al. |
| 2009/0027580 A1 | 1/2009 | Kurokawa et al. |
| 2011/0127522 A1* | 6/2011 | Yamazaki ......... H01L 21/02472 257/43 |

FOREIGN PATENT DOCUMENTS

| CN | 1584720 A | 2/2005 |
| CN | 1628389 A | 6/2005 |
| CN | 101226964 A | 7/2008 |

OTHER PUBLICATIONS

Office Action in Chinese Application No. 201410372811.4 dated Aug. 1, 2016, with English translation. 11 pages.
(Continued)

*Primary Examiner* — Hoa B Trinh
(74) *Attorney, Agent, or Firm* — Blakely Sokoloff Taylor & Zafman LLP

(57) ABSTRACT

The present disclosure relates to an aluminum electrode, a method of forming an aluminum electrode and an electronic device therewith. An aluminum electrode according to one aspect of the present disclosure comprises: a bottom layer consisting of molybdenum; a top layer consisting of molybdenum; and an aluminum layer located between the bottom layer and the top layer, wherein the bottom layer, the top layer and the aluminum layer are formed at a temperature below 120° C. An aluminum electrode according to one embodiment of the present disclosure eliminates the mouse bite phenomenon. An aluminum electrode according to another aspect of the present disclosure comprises: a bottom layer consisting of a metal or metal-alloy nitride; a top layer consisting of molybdenum; and an aluminum layer located between the bottom layer and the top layer, wherein the bottom layer, the top layer and the aluminum layer are formed at a temperature below 120° C. An aluminum electrode according to another embodiment of the present disclosure eliminates both of the mouse bite phenomenon
(Continued)

and the undercut phenomenon, and can further arrive at a desired profile angle by controlling the content of nitrogen.

6 Claims, 3 Drawing Sheets

(51) Int. Cl.
 *B32B 15/01* (2006.01)
 *C23C 14/16* (2006.01)
 *C23C 14/18* (2006.01)
(58) Field of Classification Search
 USPC .................. 257/758, 780–781, 784, 672, 788
 See application file for complete search history.

(56) References Cited

OTHER PUBLICATIONS

Office Action in Chinese application No. 201410372811.4 dated Nov. 9, 2016, with English translation. 12 pages.
Office Action in Chinese Application No. 201410372811.4 dated Apr. 12, 2017, with English translation. 9 pages.

* cited by examiner

ALUMINUM ELECTRODE, METHOD OF FORMING AN ALUMINUM ELECTRODE AND ELECTRONIC DEVICE THEREWITH

TECHNICAL FIELD

The present disclosure relates to an aluminum electrode, a method of forming an aluminum electrode and an electronic device therewith.

BACKGROUND

Currently, a gate electrode or source-drain electrode in the LCD or OLED display field uses conventionally pure aluminum or aluminum alloy to make an intermediate layer to form a three-layer electrode, for example, Mo/Al/Mo pure aluminum electrode or Mo/AlFe/Mo, Mo/AlCo/Mo, Mo/AlNi/Mo aluminum alloy electrode. The bottom layer and the top layer of such pure aluminum electrode or aluminum alloy electrode are Mo metallic layers, while for a pure aluminum electrode, an Al metallic layer is located between the bottom layer and the top layer, and for an aluminum alloy electrode, an aluminum alloy such as AlFe, AlCo or AlNi is located between the bottom layer and the top layer. Conventionally in the art, an Mo layer first formed by depositing or sputtering, etc. on a glass substrate or an ITO film layer is referred to as the bottom layer, and then an Al layer or aluminum alloy layer is formed as the intermediate layer, and an Mo layer is again formed subsequently as the top layer.

However, in the prior art, the power lines as etched will have irregular breaches at the edge which resemble traces from biting of a mouse, and this phenomenon is termed "mouse bite" in the art, as shown in the elliptic shape in FIG. 1. Further, during etching of the power lines, the etching liquid would in theory attack downward or upward vertically, but as the action of the etching liquid is not directional indeed, it produces side etching such that the conductor lines after the etching exhibit inversions at both sides in cross-section, and this phenomenon is termed "undercut" in the art, as shown in the elliptic shape in FIG. 2.

The above-mentioned mouse bite and undercut phenomena cause easily a short circuit of the power lines or a signal delay, and such problems in turn slow down the progress of electrode thinning and influence the advancement of high-resolution products. In addition, when the undercut exists in the electrode, a disconnection of the electrode may arise easily, leading to lowered performances of the electronic product, such as dark spots in an LCD or OLED display.

Past experience for solving the mouse bite problem in pure aluminum or aluminum alloy electrodes is changing the etching liquid. However, in case of the production line for mass production of variety products, this method requires changing a former conventional etching liquid during which the production of other products will be influenced, and also the re-verification and test of the etching liquid requires longer time.

Furthermore, if the profile angle in the electrode is undesirable, it would result in a relatively large segment difference (a difference between the high and low planes of the thin film) upon lap-joints of the upper film layer and thus in disconnection problem which would influence the yield of the product. For example, such a situation is shown in the elliptic shape in FIG. 3. In FIG. 3, the profile angle is approximately between 70° C. and 80° C. resulting in a relatively large segment difference, which is volunerable to disconnection problem and influences the yield of the product.

Therefore, there is an urgent need for solving the existing mouse bite, undercut, undesirable profile angle, etc. in the prior art.

SUMMARY

In view of this, the present disclosure provides an aluminum electrode, a method of forming an aluminum electrode and an electronic device therewith, which can solve or at least alleviate at least part of the drawbacks existing in the prior art.

According to a first aspect of the present disclosure, an aluminum electrode is provided and may comprise: a bottom layer consisting of molybdenum; a top layer consisting of molybdenum; and an aluminum layer located between the bottom layer and the top layer, wherein the bottom layer, the top layer and the aluminum layer are formed at a temperature below 120° C. By means of an aluminum electrode consisting of a three-layer metallic layer formed at a temperature below 120° C. of one embodiment of the present disclosure, the mouse bite phenomenon can be eliminated.

Preferably, the bottom layer, the top layer and the aluminum layer are formed at 50° C. or 80° C.

More preferably, the bottom layer, the top layer and the aluminum layer are formed at 50° C.

According to a second aspect of the present disclosure, an aluminum electrode is provided and may comprise: a bottom layer consisting of a metal or metal-alloy nitride; a top layer consisting of molybdenum; and an aluminum layer located between the bottom layer and the top layer, wherein the bottom layer, the top layer and the aluminum layer are formed at a temperature below 120° C. By means of an aluminum electrode comprising a bottom layer consisting of a metal or metal-alloy nitride formed at a temperature below 120° C. of one embodiment of the present disclosure, not only the mouse bite phenomenon but also the undercut phenomenon can be eliminated, and particularly the undercut at the bottom layer consisting of a metal or metal-alloy nitride is prevented effectively.

Preferably, the bottom layer, the top layer and the aluminum layer are formed at 50° C. or 80° C.

More preferably, the bottom layer, the top layer and the aluminum layer are formed at 50° C.

According to one embodiment of the present disclosure, the metal nitride is selected from one of $MoN_x$ and $AlN_x$, and the metal-alloy nitride is selected from one of $MoNbN_x$ and $MoWN_x$.

According to another embodiment of the present disclosure, in manufacturing the metal nitride or metal-alloy nitride, the range of x (molar ratio) is between 0 and 3. It is to be noted that in the manufacture by a depositing process, a gas flux of $N_2$ accounts for 20% to 40% of the total gas flux.

According to a further embodiment of the present disclosure, the value of x is 2.

According to one embodiment of the present disclosure, a thickness of the bottom layer is between 100 Å and 300 Å, a thickness of the aluminum layer is between 2000 Å and 4000 Å, and a thickness of the top layer is between 600 Å and 1000 Å. Alternatively, by means of the arrangement for the thickness of the respective layers and the aforesaid content of nitrogen of one embodiment of the present disclosure, not only the mouse bite and the undercut phenomena can be eliminated, but also a desired profile angle can be acquired.

According to a third aspect of the present disclosure, an electronic device is provided and comprises the aforesaid aluminum electrode.

DESCRIPTION OF DRAWINGS

The above and other features of the present disclosure will become more apparent by describing in detail the embodiments shown in conjunction with the drawings, in which.

DESCRIPTION OF EMBODIMENTS

Figure 1:
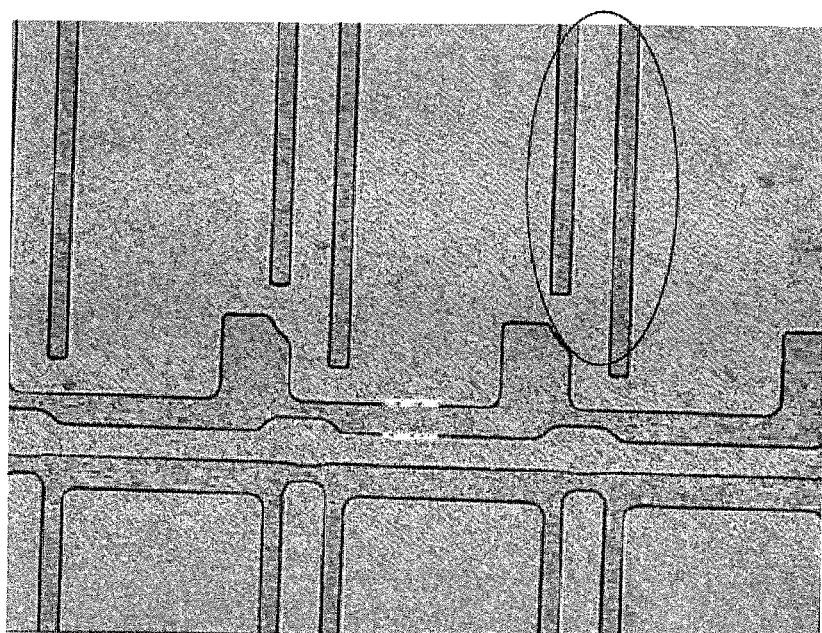
FIG. 1 schematically shows a SEM (Scanning Electron Microscope) photo of a prior art Mo/Al/Mo three-layer pure aluminum electrode, on the surface of which there are many mouse bites.

It is, first of all, to be noted that the terms relating to positions and directions mentioned in the present disclosure, such as "upper", "lower", "left" and "right", refer to directions as viewed from a frontal of the principal plane of the drawings. Therefore, the terms "upper", "lower", "left", "right", etc. relating to positions and directions in the present disclosure indicate only the relative positional relations in cases as shown in the drawings. They are given only for the purpose of illustration and are not intended for limiting the scope of the present disclosure.

Hereinafter, the present disclosure will be described in detail with reference to FIGS. 1-5.

FIG. 1 schematically shows a SEM (Scanning Electron Microscope) photo of a prior art Mo/Al/Mo three-layer pure aluminum electrode, on the surface of which there are many mouse bites, as shown in the elliptic shape for example. The Mo/Al/Mo three-layer pure aluminum electrode as shown herein is only exemplary, while a mouse bite phenomenon like this exists also in an otherwise structured pure aluminum electrode such as W/Al/W or in an aluminum-alloy electrode, which electrodes are not specifically enumerated here.

Figure 2:
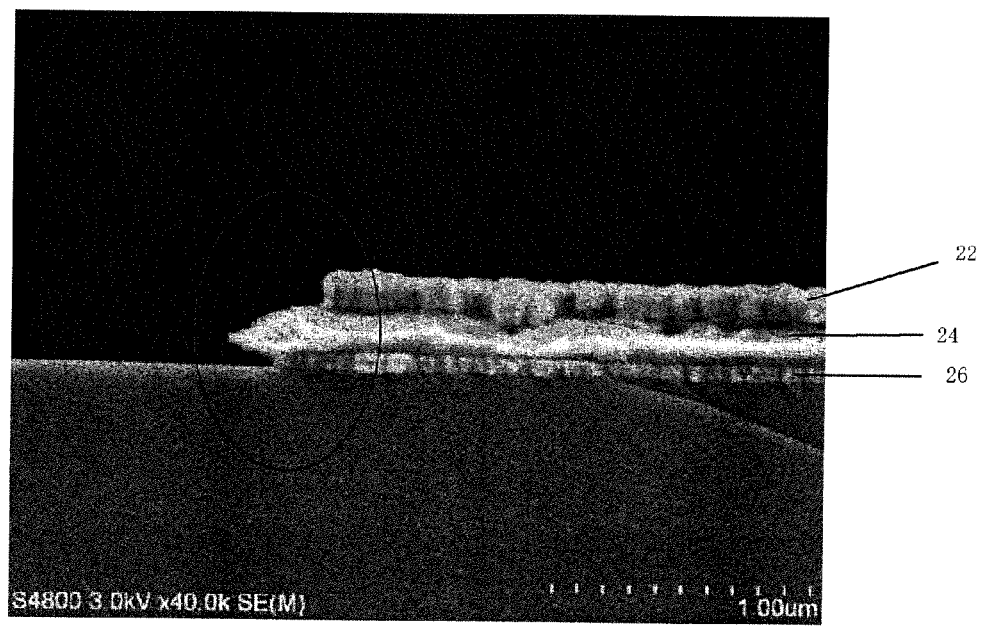
FIG. 2 schematically shows a SEM photo of a prior art Mo/Al/Mo three-layer pure aluminum electrode.

FIG. 2 schematically shows a Scanning Electron Microscope SEM photo of a prior art Mo/Al/Mo three-layer pure aluminum electrode, in which a top Mo layer 22 and a bottom Mo layer 26, as well as an Al layer 24 located between the top Mo layer 22 and the bottom Mo layer 26 are shown. The elliptic shape in FIG. 2 shows that the bottom Mo layer 26 has apparent undercut problem.

In order to solve the mouse bit phenomenon existing in the prior art, the inventor designs an orthogonal experiment as follows.

The inventor designs, in the orthogonal experiment, 3 factors and 3 levels among other elements of the film formation. The 3 factors and 3 levels in the specific experiments are shown in Table 1.

TABLE 1

3 factors and 3 levels in the experiment

| | Factors | | |
|---|---|---|---|
| Levels | Film Formation Temperature A | Film Formation Power B | Film Formation Thickness C |
| 1 | 50° C. | 10 kw | 400/2000/800 |
| 2 | 80° C. | 15 kw | 400/3000/800 |
| 3 | 120° C. | 20 kw | 400/4000/800 |

The purpose of the orthogonal experiment is to make clear what influences the factors A (film formation temperature), B (film formation power) and C (film formation thickness) have on the mouse bites, which is/are primary and which is/are secondary, so as to determine the most appropriate conditions for the formation, i.e. how much each of the film formation temperature, the film formation power and the film formation thickness is when the mouse bite phenomenon can be effectively avoided.

The design of the orthogonal experiment is based on Lg $(3^4)$, and the experiments as designed are shown in Table 2.

TABLE 2 orthogonal experimental design of the 3 factors and 3 levels in the experiment

| Experiment No. | A | B | C |
|---|---|---|---|
| 1 | 50° C. | 10 kw | 400/2000/800 |
| 2 | 80° C. | 15 kw | 400/3000/800 |
| 3 | 120° C. | 20 kw | 400/4000/800 |
| 4 | 50° C. | 15 kw | 400/3000/800 |
| 5 | 80° C. | 20 kw | 400/4000/800 |
| 6 | 120° C. | 10 kw | 400/2000/800 |
| 7 | 50° C. | 20 kw | 400/4000/800 |
| 8 | 80° C. | 10 kw | 400/2000/800 |
| 9 | 120° C. | 15 kw | 400/3000/800 |

The aluminum electrode used in the above experiments No. 1-9 is Mo/Al/Mo three-layer pure aluminum electrode. For example, in the experiment No. 1, the film formation temperature is 50° C. and the film formation power is 10 kw, upon which the chosen three layers of Mo/Al/Mo are respectively 400 Å (bottom Mo layer)/2000 Å (Al layer)/800 Å (top Mo layer). In the experiment No. 2, the film formation temperature is 80° C. and the film formation power is 15 kw, upon which the chosen three layers of Mo/Al/Mo are respectively 400 Å (bottom Mo layer)/3000 Å (Al layer)/800 Å (top Mo layer). In the experiment No. 3, the film formation temperature is 120° C. and the film formation power is 20 kw, upon which the chosen three layers of Mo/Al/Mo are respectively 400 Å (bottom Mo layer)/4000 Å (Al layer)/800 Å (top Mo layer). . .

Referring to the Mo/Al/Mo three-layer pure aluminum electrodes obtained according to the 9 sets of orthogonal experiments above, the inventor applies etching under the same optimal condition for etching to the film layers at different film formation conditions, and monitors the mouse bite phenomenon using SEM analysis after the etching is applied. The inventor finds that for each of the film formation temperature, the film formation power and the film formation thickness to influence the mouse bite phenomenon, the film formation temperature has a direct and the greatest influence on the generation of mouse bite phenomenon. Although the mouse bite phenomenon becomes serious as the thickness of the film layers increases, the film layer thickness has a smaller influence on the generation of mouse bite phenomenon. As the film formation power increases, the mouse bite phenomenon decreases and the film formation power, among the three elements, has the smallest influence on the generation of mouse bite phenomenon. For example, the inventor finds that when the film formation temperature is 50° C. and 80° C., no mouse bite phenomenon would occur after the etching, but when the film formation temperature is 120° C., the mouse bite phenomenon would be significant.

Figure 4:
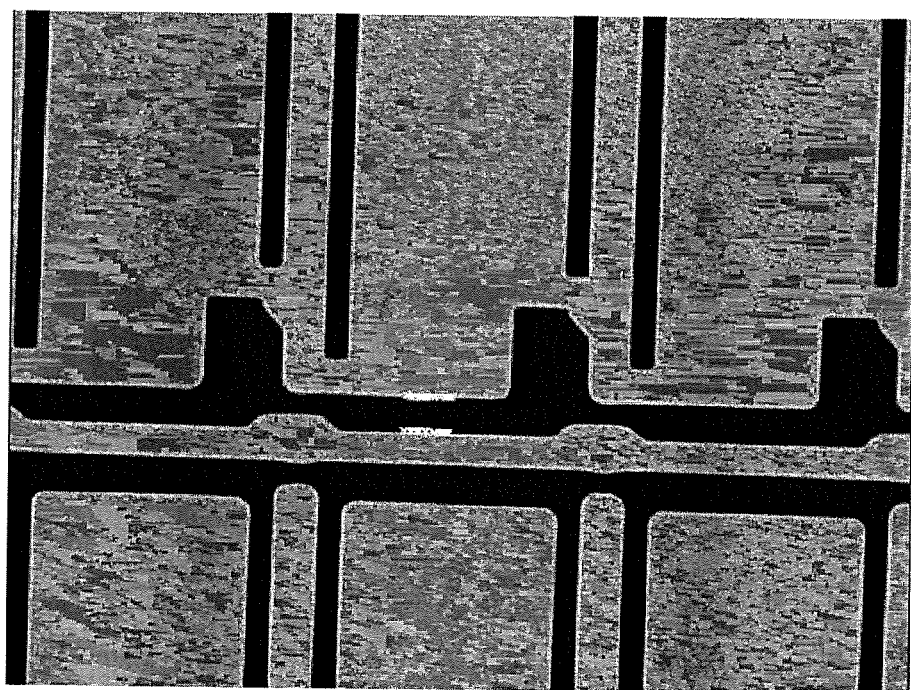
FIG. 4 schematically shows a SEM photo of a Mo/Al/Mo three-layer pure aluminum electrode according to another embodiment of the present disclosure.

Therefore, according to one aspect of the present disclosure, an aluminum electrode is provided and may comprise: a bottom layer consisting of molybdenum; a top layer consisting of molybdenum; and an aluminum layer located between the bottom layer and the top layer, wherein the bottom layer, the top layer and the aluminum layer are formed at a temperature below 120° C. No mouse bite phenomenon is found with the aluminum electrode consisting of three metallic layers of Mo/Al/Mo formed at a temperature below 120° C. by a depositing or sputtering process, etc. . . Preferably, a Mo/Al/Mo three-layer aluminum electrode is formed at 80° C. by a depositing or sputtering process, etc. . . Various thin-film formation techniques are known in the art and will not be repeated here. More preferably, a Mo/Al/Mo three-layer aluminum electrode is formed at 50° C. by a depositing or sputtering process, etc. . . The intermediate layer as illustrated above is an Al layer and it is only exemplary, while for the other aluminum-alloy electrode using AlFe, AlCo or AlNi as the intermediate layer, there would be no mouse bite phenomenon as well when the three-layer aluminum-alloy electrode is formed at a temperature below 120° C. by a depositing or sputtering process, etc. . . Accordingly, the aluminum electrode according to the present disclosure should not be limited to a pure aluminum electrode, but may cover the scope of an alumium-alloy electrode. FIG. 4 schematically shows a SEM photo of a Mo/Al/Mo aluminum electrode formed at a temperature below 120° C. according to one embodiment of the present disclosure.

Although the Mo/Al/Mo three-layer pure aluminum electrode designed by the inventor formed according to the above formation conditions solves the mouse bite phenomenon, the undercut problem still exists before it is perfect. In order to solve the undercut problem, the inventor introduces a novel buffer layer material into the pure aluminum electrode. For example, the undercut problem can be effectively eliminated by introducing in the pure aluminum electrode a $MoN_x$ electrode layer alternatively to the bottom Mo electrode layer, because for $MoN_x$ the etching rate is apparently slower than for Mo, and thus when etching, an etching rate of the etching liquid for the bottom Mo layer can be retarded avoiding the occurrence of undercut phenomenon. The inventor further finds that not only a $MoN_x$ electrode layer alternatively to the bottom Mo electrode layer can be used to effectively avoid the undercut phenomenon, but other metal nitrides, such as $AlN_x$, or metal-alloy nitrides, such as $MoNbN_x$ and $MoWN_x$, can also be used to effectively avoid the undercut phenomenon. Based directly on the finding, according to a second aspect of the present disclosure the inventor proposes an aluminum electrode, comprising: a bottom layer consisting of a metal or metal-alloy nitride; a top layer consisting of molybdenum; and an aluminum layer located between the bottom layer and the top layer, wherein the bottom layer, the top layer and the aluminum layer are formed at a temperature below 120° C. By means of an aluminum electrode comprising a bottom layer consisting of a metal or metal-alloy nitride formed at a temperature below 120° C. of the present disclosure, not only the mouse bite phenomenon but also the undercut phenomenon can be eliminated, and particularly the undercut at the bottom layer consisting of a metal or metal-alloy nitride is prevented effectively. Preferably, the bottom layer, the top layer and the aluminum layer are formed at 50° C. or 80° C.

Figure 3:
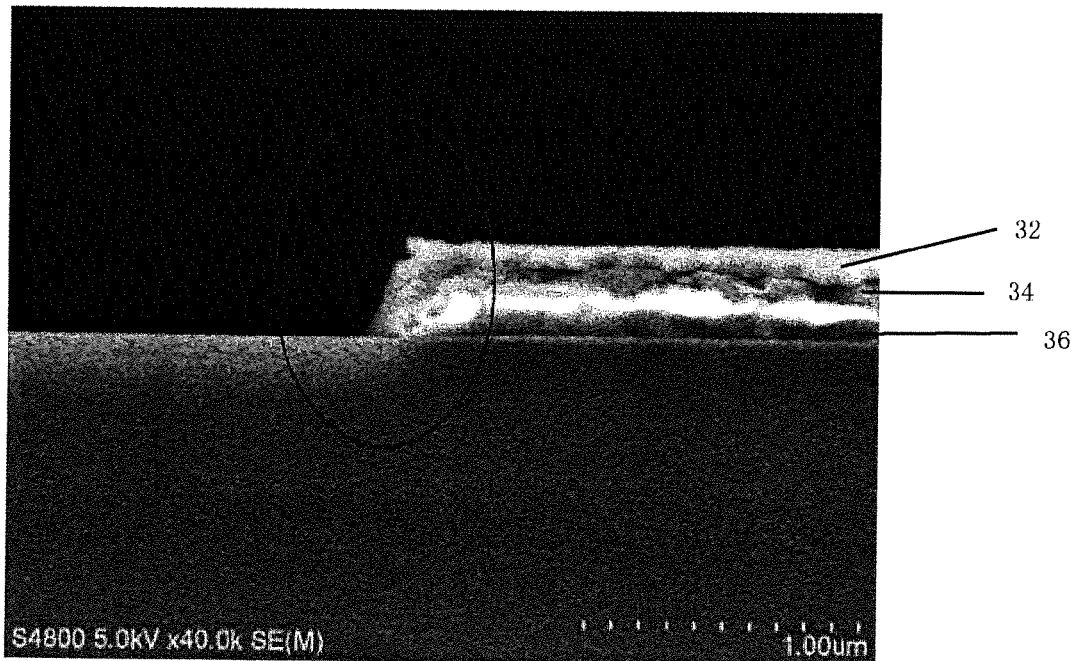
FIG. 3 schematically shows a SEM photo of a $MoN_x$/Al/Mo three-layer pure aluminum electrode according to one embodiment of the present disclosure.

Another problem is that in each of the above designed embodiments, although the aluminum electrode comprising a bottom layer consisting of a metal or metal-alloy nitride formed at a temperature below 120° C. can eliminate both of the mouse bite phenomenon and the undercut phenomenon, there is too large a profile angle. FIG. 3 schematically shows a SEM photo of a $MoN_x$/Al/Mo three-layer pure aluminum electrode according to one embodiment of the present disclosure, in which the elliptic shape shows such a situation within. Although the three-layer pure aluminum electrode consisting of a bottom $MoN_x$ layer 36, an intermediate Al layer 34 and a top Mo layer 32 has no undercut problem, the profile angle is approximately between 70° C. and 80° C., which results easily in a relatively large segment difference, causes the problem of disconnection, and influences the yield of the product.

In order to advantageously solve both of the mouse bite and the undercut problems while overcoming the overly large profile angle, the inventor envisions as follows. A metal nitride $MoN_x$ or a metal-alloy nitride, such as $MoNbN_x$ and $MoWN_x$, is used as the bottom layer, with a thickness between 100 Å and 300 Å, while the top layer has a thickness between 600 Å and 1000 Å, and the intermediate aluminum layer has a thickness between 2000 Å and 4000 Å. More preferably, the metal nitride $MoN_x$ is used as the bottom layer. Preferably, in manufacturing the metal nitride or metal-alloy nitride, the range of x (molar ratio) is between 0 and 3. It is to be noted that in the manufacture by a depositing process, a gas flux of $N_2$ accounts for 20% to 40% of the total gas flux. More preferably, in the metal or metal-alloy nitride the content of nitrogen x is 2.

Figure 5:
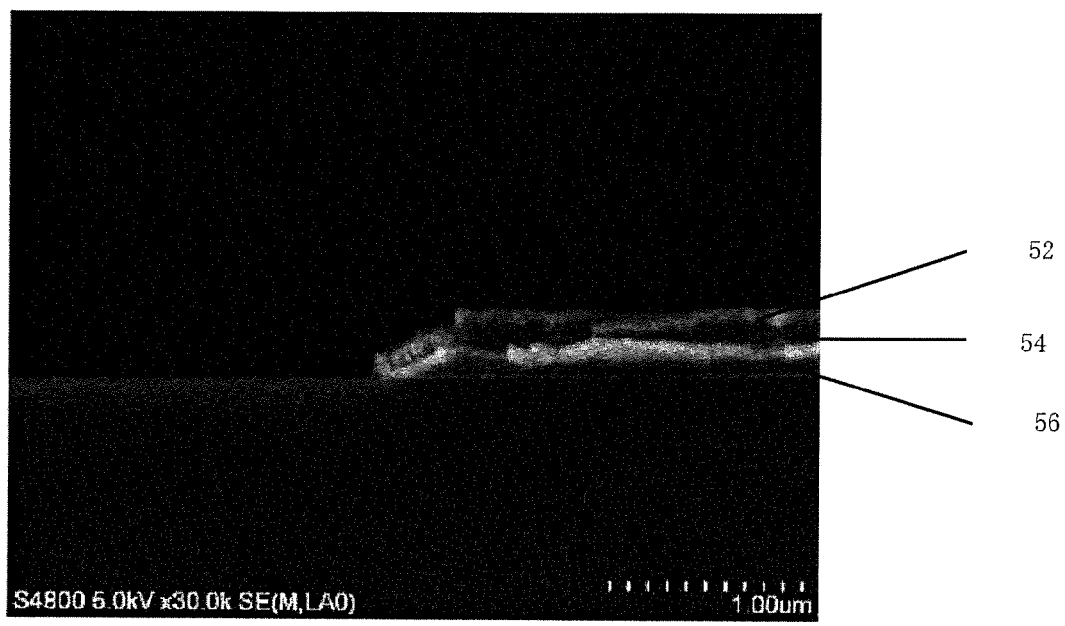
FIG. 5 schematically shows a SEM photo of a $MoN_x$/Al/Mo three-layer pure aluminum electrode according to a further embodiment of the present disclosure.

In a preferred embodiment of the present disclosure, by selecting a $MoN_x$ of 200 Å with 30% content of nitrogen (x is 3) as the buffer layer material for the bottom layer, a Mo of 600 Å to 1000 Å as the buffer layer material for the top layer of the pure aluminum electrode, and an Al of 2000 Å to 4000 Å as the intermediate layer material for the pure aluminum electrode, a desired profile angle can be acquired. FIG. 5 schematically shows a SEM photo of a $MoN_x$/Al/Mo three-layer pure aluminum electrode according to one embodiment of the present disclosure, in which none of the mouse bite phenomenon, the undercut phenomenon and the problem of an overly large profile angle is present or each has been properly solved. In FIG. 5, the three-layer pure aluminum electrode consisting of a bottom $MoN_x$ layer 56, an intermediate Al layer 54 and a top Mo layer 52 has a better profile angle, approximately between 30° C. and 60° C., which is favorable to reducing the segment difference between high and low surfaces of the thin film and minimizes the risk of disconnection.

According to a third aspect of the present disclosure, a method of forming an aluminum electrode is provided and may comprise the steps of: forming a bottom layer consisting of molybdenum at a temperature below 120° C.; a top layer consisting of molybdenum; and an aluminum layer located between the bottom layer and the top layer. The bottom layer, the aluminum layer and the top layer are formed, for example, by using thin-film formation techniques such as depositing or sputtering, etc. . . . Various thin-film formation techniques are known in the art and will not be repeated here. By means of an aluminum electrode consisting of three metallic layers of Mo/Al/Mo formed at a temperature below 120° C. of one embodiment of the present disclosure, the mouse bite phenomenon is eliminated.

Preferably, the bottom layer consisting of molybdenum, the top layer consisting of molybdenum, and the aluminum layer located between the bottom layer and the top layer are formed at 50° C. or 80° C.

According to a fourth aspect of the present disclosure, a method of forming an aluminum electrode is provided and may comprise the steps of: forming a bottom layer consisting of a metal or metal-alloy nitride at a temperature below 120° C.; a top layer consisting of molybdenum; and an aluminum layer located between the bottom layer and the top layer. By means of an aluminum electrode comprising a bottom layer consisting of a metal or metal-alloy nitride formed at a temperature below 120° C. of one embodiment of the present disclosure, not only the mouse bite phenomenon but also the undercut phenomenon can be eliminated, and particularly the undercut at the bottom layer consisting of a metal or metal-alloy nitride is prevented effectively. Preferably, the bottom layer consisting of a metal or metal-alloy nitride, the top layer consisting of molybdenum, and the aluminum layer located between the bottom layer and the top layer are formed at 50° C. or 80° C.

Preferably, the metal nitride is selected from one of $MoN_x$ and $AlN_x$, and the metal-alloy nitride is selected from one of $MoNbN_x$ and $MoWN_x$. In manufacturing the metal nitride or metal-alloy nitride, the range of x (molar ratio) is between 0 and 3. It is to be noted that in the manufacture by a depositing process, a gas flux of $N_2$ accounts for 20% to 40% of the total gas flux. Preferably, x (molar ratio) is 2. More preferably, the metal nitride is $MoN_x$.

In one embodiment of the present disclosure, a thickness of the bottom layer is between 100 Å and 300 Å, a thickness of the top layer is between 600 Å and 1000 Å, and a thickness of the aluminum layer is between 2000 Å and 4000 Å.

According to a fifth aspect of the present disclosure, an electronic device is provided and may comprise an aluminum electrode according to any of the above embodiments or is applied a method of forming an aluminum electrode according to any of the above embodiments.

By means of an aluminum electrode, a method of forming an aluminum electrode and an electronic device therewith provided by the present disclosure, at least one of the mouse bite, undercut and large profile angle problems can be solved, which facilitates improving the yield and improving the efficiency of production.

Although the present disclosure has been described with reference to the embodiments within current considerations, it is appreciated that the present disclosure is not limited to the disclosed embodiments. On the contrary, the present disclosure is intended to cover various modifications and equivalent arrangements involved in the spirit and scope of the appended claims. The scope of the following claims conforms to the most comprehensive explanation so as to include such modifications as well as equivalent structures and functions.

The invention claimed is:

1. An aluminum electrode comprising:
a bottom layer consisting of a metal nitride or a metal-alloy nitride;
a top layer consisting of molybdenum; and
an aluminum layer located between the bottom layer and the top layer, wherein the bottom layer, the top layer and the aluminum layer are formed at a temperature below 120° C.,
wherein the metal nitride is selected from one of $MoN_x$ and $AlN_x$, and the metal-alloy nitride is selected from one of $MoNbN_x$ and $MoWN_x$.

2. The aluminum electrode of claim 1, wherein the bottom layer, the top layer and the aluminum layer are formed at 50° C. or 80° C.

3. The aluminum electrode of claim 1, wherein the range of x is between 0 and 3.

4. The aluminum electrode of claim 3, wherein x is 2.

5. The aluminum electrode of claim 1, wherein a thickness of the bottom layer is between 100Å and 300Å, a thickness of the aluminum layer is between 2000Å and 4000Å, and a thickness of the top layer is between 600Å and 1000Å.

6. An electronic device comprising the aluminum electrode according to claim 1.

* * * * *